(12) United States Patent
Hoogzaad et al.

(10) Patent No.: US 6,489,814 B2
(45) Date of Patent: Dec. 3, 2002

(54) TRACK AND HOLD AMPLIFIER

(75) Inventors: Gian Hoogzaad; Eise Carel Dijkmans; Raf Lodewijk Jan Roovers, all of Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/817,969

(22) Filed: Mar. 27, 2001

(65) Prior Publication Data

US 2001/0045847 A1 Nov. 29, 2001

(30) Foreign Application Priority Data

Mar. 28, 2000 (EP) .............................. 00201119

(51) Int. Cl.[7] .............................................. G11C 27/02
(52) U.S. Cl. .......................................... 327/94; 327/95
(58) Field of Search ............................... 327/91, 93–96, 327/337; 341/122, 123, 125

(56) References Cited

U.S. PATENT DOCUMENTS

| | | | | |
|---|---|---|---|---|
| 4,806,790 A | * | 2/1989 | Sone | 327/94 |
| 5,047,666 A | * | 9/1991 | Astegher et al. | 327/94 |
| 5,457,418 A | * | 10/1995 | Chang | 327/94 |
| 5,583,459 A | * | 12/1996 | Sone | 327/95 |
| 5,801,555 A | * | 9/1998 | Kwon | 327/94 |
| 6,028,459 A | * | 2/2000 | Birdsall et al. | 327/94 |
| 6,323,700 B2 | * | 11/2001 | Hoogzaad | 327/108 |

OTHER PUBLICATIONS

"A 12–b, 60–Msample/s Cascaded Folding and Interpolating ADC", by Pieter Vorenkamp et al., IEEE Journal of Solid State Circuits, vol. 32, No. 12, Dec. 1997, pp. 1876–1886.

* cited by examiner

*Primary Examiner*—Terry D. Cunningham
*Assistant Examiner*—Long Nguyen
(74) *Attorney, Agent, or Firm*—Steven R. Biren

(57) ABSTRACT

A track and hold amplifier for use in analog/digital-converters comprises, in succession, an input buffer, a pn-junction switch and hold a capacitor. A feedback is provided between the hold capacitor and the input buffer and a second pn-junction switch is provided to disable the feedback during the hold mode.

17 Claims, 3 Drawing Sheets

TRACK AND HOLD AMPLIFIER

BACKGROUND OF THE INVENTION

This invention relates to a track and hold amplifier comprising an input buffer for receiving an input signal and for transferring the received input signal to a first terminal of a pn-junction switch having a second terminal connected to a hold capacitor, and means to supply a switching signal to said first terminal of the pn-junction switch for translating the buffered input signal through the switching pn-junction to the hold capacitor during a track mode and for blocking this transfer during a hold mode. A track and hold amplifier of this kind is known from the article "A 12-$b$, 60-Msample/s Cascaded Folding and Interpolating ADC", by P. Vorenkemp and R. Rovers in IEEE *Journal of Solid State Circuits*, Vol 32, No 12, December 1997, Pages 1874–1886.

A track and hold amplifier is often used in the input of an analog to digital converter to separate the sampling operation from the quantization operation. Present day multistep AD-architecture has a number of comparators, which do not operate simultaneously. However, it is necessary that all the comparators see the same analog signal value. The function of the track and hold amplifier is to determine the voltage level of the input signal at the sampling instant of the track and hold amplifier, and to maintain this value during a certain time period, so as to ensure that all comparators see the same analog input value. Moreover, each comparator has input capacitance which causes the input signal level to be compared to reach its correct level only after some delay. Therefore, without a track and hold amplifier, the comparator would compare an incorrect signal level, especially at higher signal frequencies. The track and hold amplifier samples the input signal at the correct value and maintains this value during the hold mode, so that the comparator-input has enough time to reach its correct signal level for subsequent quantization.

A drawback of the abovementioned prior art track and hold amplifier is that during the track mode larger currents flow into the hold capacitor, especially at higher signal frequencies. These larger currents flow into the holding capacitance through the pn-junction switch. This results in large non linear signal distortion and consequently in incorrect signal sampling. The signal distortion, caused by the pn-junction, may easily reach values of some tens of millivolts, which is too large for modem applications, where the total signal amplitude is not more than 1 Volt.

SUMMARY OF THE INVENTION

The present invention has it for its objects to overcome this drawback of the prior art track and hold amplifier. The track and hold amplifier of the present invention is therefore characterized by a feedback connection from the second terminal of the pn-junction switch to the input buffer and means to enable the feedback during the track mode and to disable the feedback during the hold mode. The feedback from the second terminal of the pn-junction switch to the input buffer reduces the signal distortion to the first terminal of the pn-junction switch, where it does no harm. However, this feedback has a detrimental effect on the hold feedthrough of the amplifier because the input signal could reach the holding capacitance through this feedback path. Therefore the feedback is disabled during the hold mode. The feedback may for instance be disabled during the hold mode by cutting off the current through the input buffer. The however has, inter alia, the drawback that the input impedance of the amplifier varies with the track and hold switching signal. A preferred arrangement according to the invention is therefore characterized in that said means to enable the feedback during the track mode and to disable the feedback during the hold mode comprises a second pn-junction switch within said feedback connection and second means to supply the switching signal to the second pn-junction switch.

The said second means to supply the switching signal to the second pn-junction switch may cause a large voltage jump on the part of the feedback connection between the input buffer and the second pn-junction switch. This voltage jump may cause interference of the voltage of the hold capacitor through the junction capacitance of the second pn-junction switch. It is a further object of the invention to limit this interference and the track and hold amplifier of the invention may be further characterized by clamping means connected to the part of the feedback connection between the input buffer and the second pn-junction switch.

It is another object of the invention to provide a track and hold amplifier which is characterized by resistive means between the second terminal of the first pn-junction switch and the hold capacitor for increasing the stability of the feedback path.

BRIEF DESCRIPTION OF THE DRAWING

These and other aspects of the invention will be further explained with reference to the attached drawings, in which.

DESCRIPTION OF THE PREFERRED EMBODIMENTS

Figure 1:
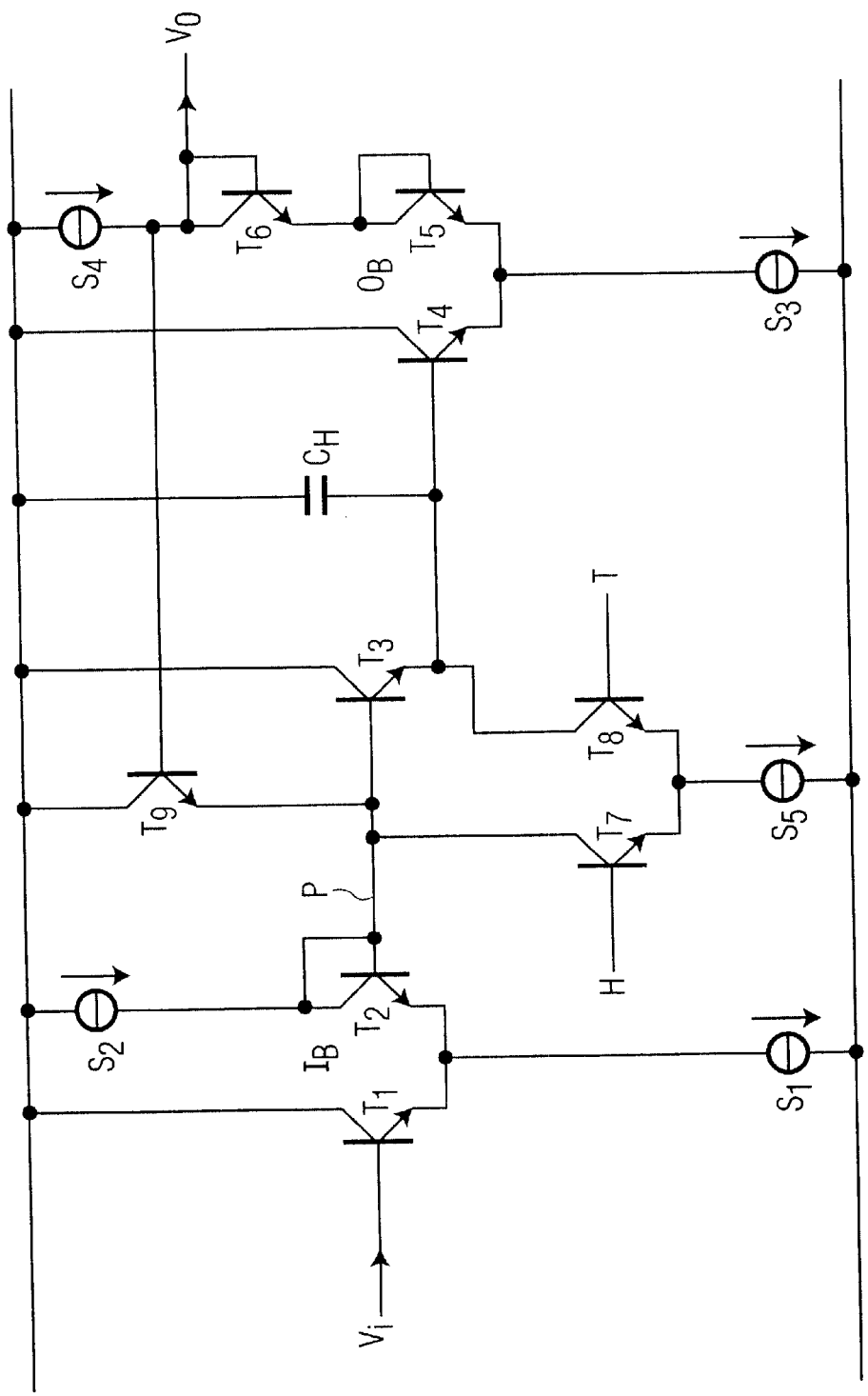
FIG. 1 is an embodiment of track and hold amplifier which is known in the art.

The prior art track and hold amplifier of FIG. 1 comprises an input buffer $I_b$ with a first emitter-coupled transistor pair $T_1$–$T_2$ and a common emitter current source $S_1$. The transistor $T_2$ has its collector- and base-electrodes interconnected and a collector load current source $S_2$. This well known arrangement transfer an input signal voltage $V_i$, applied to the base electrode of transistor $T_1$, to a substantially identical voltage at the base electrode of transistor $T_2$, especially when the current of the source $S_1$ is twice the current of source $S_2$. The output of the input buffer is coupled, through a connection point p to the base electrode of a switching emitter follower transistor $T_3$. The emitter electrode of this transistor $T_3$ is connected to a hold capacitor $C_H$ and to the input of an output buffer $O_B$. The output buffer comprises a second emitter-coupled transistor pair $T_4$–$T_5$ with a common emitter current sorce $s_3$. The transistor $T_5$ has its collector- and base-electrodes interconnected and has a collector load current source $S_4$. Moreover a DC-shift transistor $T_6$ with interconnected collector and base electrode, is inserted between the collector electrode of transistor $T_5$ and the current source $S_4$. The interconnection between the current source $S_4$ and the DC-shift transistor $T_6$ constitutes the output O of the track and hold amplifier.

The arrangement further comprises a third emitter-coupled transistor-pair $T_7$–$T_8$ with common emitter-current source $S_5$. The collector-electrode of transistor $T_7$ is connected to the base-electrode of the emitter follower transistor $T_3$ and the collector electrode of transistor $T_8$ is connected to the emitter electrode of transistor $T_3$. The base electrode of the transistors $T_7$ and $T_8$ recieve a track and hold switching pulse T/H which makes the base electrode of the transistor $T_8$ high and the base electrode of the transistor $T_7$ low during the track mode and, inversely, the base electrode of transistor $T_8$ low and that of transistor $T_7$ high during the hold mode.

In operation, during the track mode the current of current source $S_5$ flows through the transistor $T_8$ into the emitter electrode of the emitter follower transistor $T_3$. Consequently, the signal voltage $V_i$, which is applied through the input buffer to the base electrode of transistor $T_3$, appears at low impedance and one $V_{be}$ junction voltage shift lower at the hold capacitor $C_H$ and at the input of the output buffer $O_B$. Equally as with the input buffer, especially when the current of source $S_3$ is twice the current of source $S_4$, the currents through the transistors $T_4$ and $T_5$ are equal, so that the base (and collector) voltage of transistor $T_5$ is equal to the base voltage of transistor $T_4$. The buffered signal is shifted upwardly one $V_{be}$ junction voltage by transistor $T_6$ in order to compensate for the downward voltage shift caused by the emitter follower transistor $T_3$, and thereafter applied to the output O of the amplifier. Consequently, during the track mode, the output signal of the track and hold amplifier is substantially equal to the input signal.

During the hold mode, the current of source $S_5$ flows through the transistor $T_7$ and pulls the voltage of point P down. Now the transistor $T_3$ is switched off and the base voltage of transistor $T_4$ and consequently the output voltage at terminal O is determined by the voltage of the hold capacitor at the level which it had at the end of the track mode. It may be noted,, that the voltage drop at point P biases the emitter-base junction of transistor $T_2$ in cutoff direction. Therefore the function of the input buffer, apart from lowering the impedance level at the input during the track mode, is also to isolate point P from the input signal source during the hold mode, so that the voltage of point P is allowed to be pulled downwardly.

The arrangement of FIG. 1 additionally has a clamping transistor $T_9$, whose base electrode is connected to the output terminal O and whose emitter electrode is connected to point P. During the track mode the voltage at point P and the voltage at the output terminal O are substantially equal so that the clamping transistor $T_9$ is cut off and inoperative. During the hold mode, however, if point P is pulled down more than one $V_{be}$ junction voltage, the transistor $T_9$ becomes conducting thereby limiting the voltage drop at point P to one $V_{be}$ junction voltage. This measure is taken because a too large voltage drop at point P would result, through the parasitic base-emitter capacitance of transistor $T_3$, in a too large transient pulse in the output voltage.

A drawback of the prior art arrangement of FIG. 1 is that during the track mode the signal variations cause large currents flowing into the hold capacitor $C_H$, especially at the higher signal frequencies of e.g. 20 Mhz. These large currents flow into the hold capacitor through the emitter follower transistor $T_3$ and thereby cause, across the non-linear base-emitter junction of this transistor large and non-linear voltage variations, so that the track and hold amplifier actually samples and holds a distorted signal level.

Figure 2:
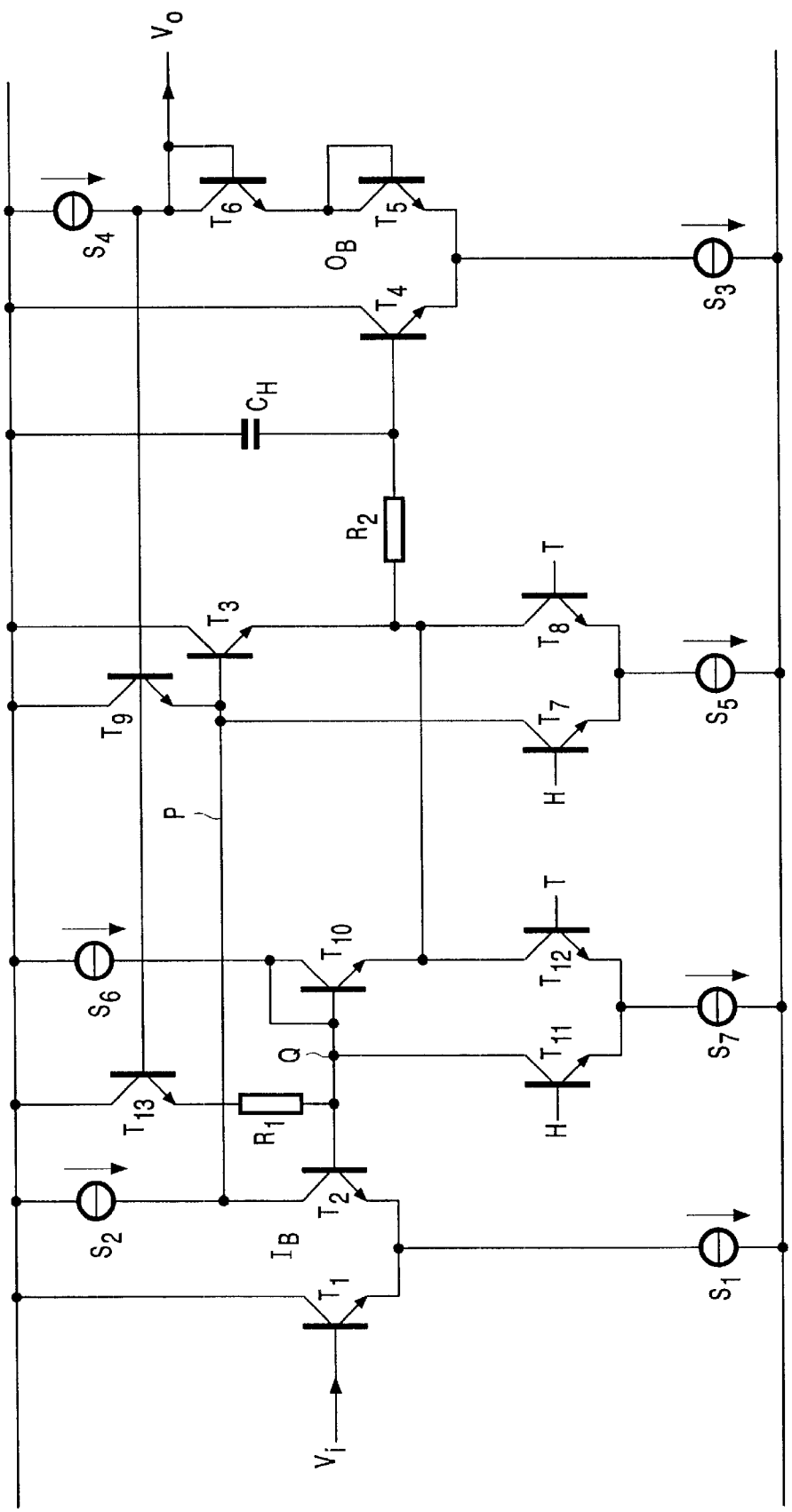
FIG. 2 is a first embodiment of a track and hold amplifier according to the invention and FIG. 3 is a second embodiment of a track and hold amplifier according to the invention .

The arrangement of FIG. 2, in which corresponding circuit elements as in FIG. 1 have the same reference numerals, seeks to avoid the above described distortion. In this arrangement the base electrode of transistor $T_2$, in stead of being coupled to the collector electrode of this transistor, is coupled, through a transistor $T_{10}$, to the emitter electrode of transistor $T_3$, so that a feedback loop is constituted from the collector electrode of transistor $T_2$ through the base-emitter junction of transistor $T_3$ and through the transistor $T_{10}$ to the base electrode of transistor $T_2$. While the input buffer seeks to make the base voltage of $T_2$ substantially equal to the input voltage, this feedback loop seeks to make the emitter voltage of transistor $T_3$ substantially equal to the base voltage of transistor $T_2$, so that, as a result, the emitter voltage of transistor $T_3$ represents the input voltage substantially without distortion. In fact, the distortion which is caused by the emitter-base junction of transistor $T_3$ appears now at the base electrode of his transistor instead of at the emitter electrode.

When the base electrode of transistor $T_2$ and the emitter electrode of transistor $T_3$ would be directly connected to each other, a problem arises during the hold mode. During this mode the transistor $T_3$ is cut off so that the base electrode of $T_2$ now follows the hold voltage of the hold capacitor $C_H$. When the input voltage $V_i$ rises during the hold mode the base emitter junction of transistor $T_2$ blocks, however when the input voltage decreases the base emitter junction of transistor $T_2$ conducts a large current which (de)charges the hold capacitor so that the hold voltage is distorted. This undesired hold mode feedthrough is prevented by the insertion of a pn-junction switch in the feedback path between the emitter electrode of $T_3$ and the base electrode of $T_2$. In the arrangement of FIG. 2 this switch is implemented by the transistor $T_{10}$, which has interconnected base- and collector electrodes and therefore operates as a diode. To operate this switch the arrangement of FIG. 2 further comprises a current source $S_6$ connected to the collector/base of transistor $T_{10}$ and a fourth emitter coupled transistor pair $T_{11}$–$T_{12}$ with an emitter current source $S_7$, with the collector of transistor $T_{11}$ connected to the base electrode of transistor $T_{10}$ and the collector electrode of transistor $T_{12}$ connected to the emitter electrode of transistor $T_{10}$. Equally as in the case of the transistor pair $T_7$–$T_8$, the base electrodes of the transistors $T_{11}$ and $T_{12}$ receive a track and hold switching pulse T/H. During the track mode, the current of source $S_6$ flows through the transistors $T_{10}$ and $T_{12}$, so that the base emitter junction of transistor $T_{10}$ is conductive. On the other hand, during the hold mode and provided the current of source $S_7$ is larger than the current of source $S_6$, the current of source $S_6$ flows through the transistor $T_{11}$, the base-emitter junction of transistor $T_{10}$ is cut off and the aforementioned undesired hold mode feedthrough is prevented.

It may be observed that the original track mode distortion by the conductive base-emitter junction of transistor $T_3$ in the arrangement of FIG. 1, is not replaced in the arrangement of FIG. 2 by a similar distortion due to the conductive base-emitter junction of $T_{10}$. This is because through the conductive base-emitter junction of $T_{10}$ substantially only DC current flows and the AC signal-current flowing through this junction is negligible.

It is further observed, that, during the hold mode, the conductive transistor $T_{11}$ pulls down the voltage of point Q, i.e. the interconnection of the base electrodes of the transistors $T_2$ and $T_{10}$. This pull down may be limited by a further clamping transistor $T_{13}$ which has its base electrode connected to the output terminal O and its emitter electrode to point Q. This voltage pull down of point Q does not only cut off the transistor $T_{10}$ but also the transistor $T_2$, which gives a further reduction of the hold mode feedthrough. If the voltage pull down at point Q is not sufficiently large to cutoff the transistor $T_2$ for all values of the input voltage Vi, this pull down can be increased by inserting a resistor ($R_1$) of appropriate value in the emitter lead of clamping transistor $T_{13}$.

A further resistor $R_2$ is included between the emitter electrode of the switched emitter follower transistor $T_3$ and the hold capacitor $C_H$. The function of this resistor is threefold:

The emitter of transistor $T_3$ represents an inductive impedance which, with the large hold capacitor $C_H$ constitutes an LC-loop. The resistor $R_2$ damps out undesired ringing of this LC-loop.

The resistor $R_2$ filters KT/C noise from reaching the hold capacitor $C_H$.

The resistor $R_2$ separates the hold capacitor $C_H$ from the feedback loop $T_3$, $T_{10}$, $T_{12}$. This improves the stability of this feedback loop.

An alternative arrangement is shown in FIG. 3, in which again corresponding elements as in FIGS. 1 and 2 have the same reference numerals. As in the arrangement of FIG. 2, this has also a feedback connection from the emitter electrode of transistor $T_3$ to the base electrode of transistor $T_2$, however in this arrangement the switching transistor $T_{10}$ fails. In order to disable the feedback during the hold mode, the current source $S_1$ of the input buffer has been replaced by an emitter-coupled transistor pair $T_{14}$–$T_{15}$ with common emitter source $S_8$. The collector electrode of transistor $T_{15}$ is connected to the common emitter electrodes of transistor pair $T_1$–$T_2$ and the collector electrode of transistor $T_{14}$ is connected to the positive supply. A further current source $S_9$ is connected between the positive supply and the common emitters of $T_1$ and $T_2$. The base electrodes of transistor pair $T_{14}$–$T_{15}$ receive the track and hold switching pulse T/H, which makes the base electrode of $T_{15}$ high during the track mode and which makes the base electrode of $T_{14}$ high during the hold mode.

In operation, during the track mode, with the transistor $T_{15}$ conducting and the transistor $T_{14}$ cut off, the coupled emitter electrodes of $T_1$ and $T_2$ carry the current of source $S_8$ minus the current of source $S_9$. With the current of $S_8$ greater than the current of $S_9$, the difference current has the same function as the current of source $S_1$ in the arrangements of FIGS. 1 and 2 and the transistors $T_1$ and $T_2$ operate as usual for buffering the input signal. During the hold mode, the transistor $T_{15}$ is cut off and the transistor $T_{14}$ conducts the current of the source $S_8$. The current of the source $S_9$ now lifts the potential of the two emitter electrodes of $T_1$ and $T_2$, thereby cutting off these two transistors. With the transistor $T_2$ cut off, the feedback from the emitter electrode of transistor $T_3$ to the transistor $T_2$ is disabled and the hold mode feedthrough through this connection is largely prevented. Therefore, in the arrangement of FIG. 3 the transistor $T_2$ has taken over the function of the transistor $T_{10}$ in the arrangement of FIG. 2. The simultaneous cut off of the transistor $T_1$ assists in the reduction of the hold mode feedthrough.

Figure 3:
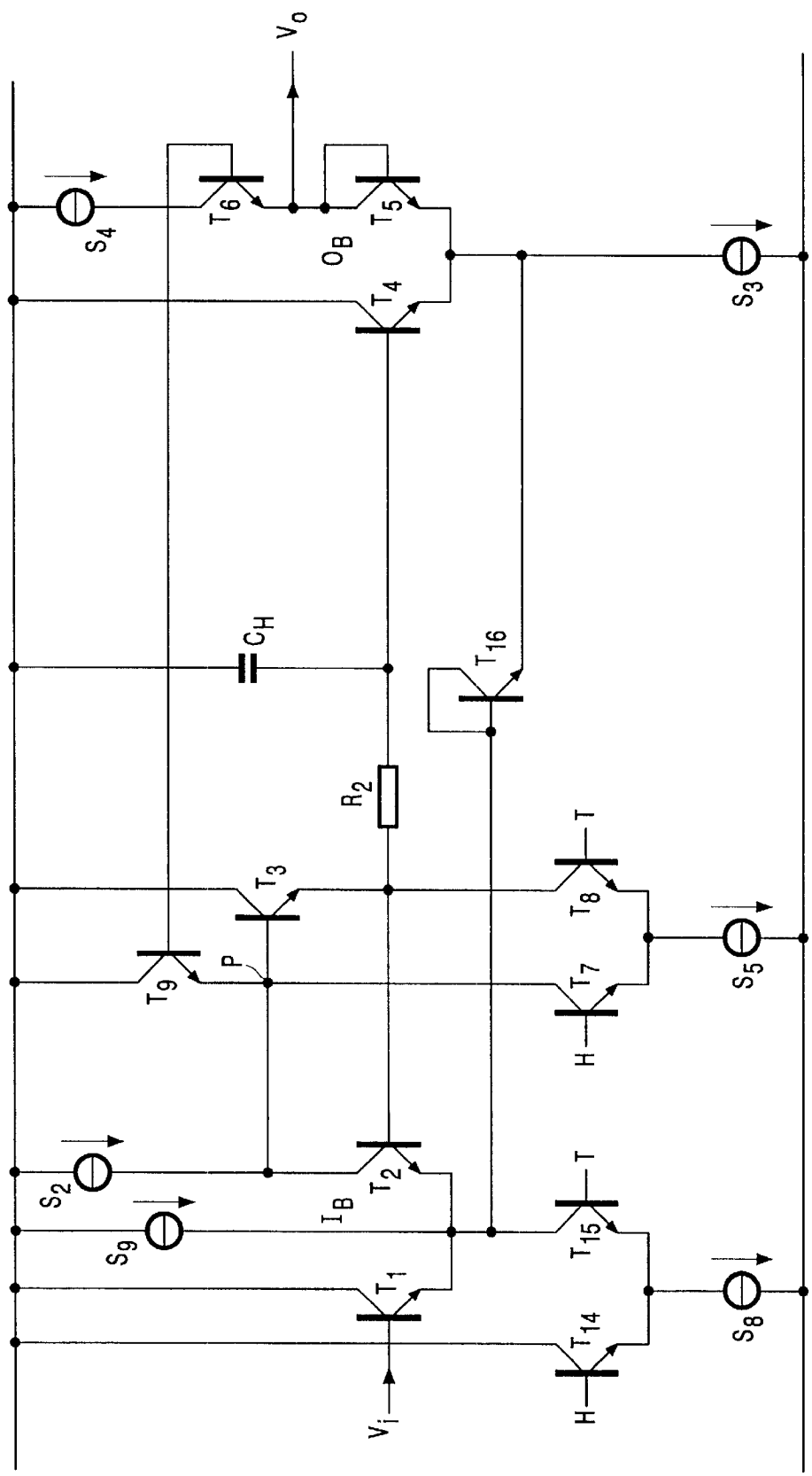

In order to reduce the amplitude of the voltage pulse at the common emitter electrodes of the transistor pair $T_1$–$T_2$, a clamping transistor (diode) $T_{16}$ with interconnected base- and collector electrodes, is connected between the common emitters of the input buffer $T_1$–$T_2$ and the common emitters of the output buffer $T_4$–$T_5$. During the track mode, both common emitters have substantially the same potential, namely the input signal voltage $V_i$ minus one $V_{be}$ junction voltage. The clamping transistor $T_{16}$ conducts during the hold mode and prevents that the voltage of the emitters of $T_1$ and $T_2$ rises above the input signal voltage $V_i$. In the arrangement of FIG. 3 the output terminal O is connected between the transistors $T_5$ and $T_6$, because in this arrangement, due to the absence of a transistor $T_{10}$, the voltage at the input of the output buffer is one $V_{be}$ junction voltage shift higher than in the arrangement of FIG. 2.

In practice, the arrangement of FIG. 2 may be preferred over the arrangement of FIG. 3 because the latter consumes less energy from the dc supply. Moreover a disadvantage of the arrangement of FIG. 3 is that the input impedance of the arrangement changes with the track and hold switching because the transistor $T_1$ is conducting during the track mode and cut off during the hold mode.

What is claimed is:

1. A track and hold amplifier comprising:
   an input buffer for receiving input signal and for transferring the received input signal to a first termnal of a pn-junction switch, a second terminal of which is connected to a hold capacitor, and means for supplying a switching signal to said first terminal of pn-junction switch for translating the buffered input signal through the switching pn-junction to the hold capacitor during a track mode and for blocking such transfer during a hold mode, characterized by a feedback connection from the second terminal of the pn-junction switch ($T_3$) to the input buffer ($I_B$), and means to enable the feedback connection during the track mode and to disable the feedback connection during the hold mode.

2. A track and hold amplifier as claimed in claim 1, characterized in that said means to enable the feedback connection during the track mode and to disable the feedback connection during the hold mode comprise a second pn-junction switch within said feedback connection and second means for supplying the switching signal to the second pn-junction switch.

3. A track and hold amplifier as claimed in claim 2, characterized by clamping means connected to a circuit point between the input buffer and the second pn-junction switch.

4. A track and hold amplifier as claimed in claim 1, characterized by resistive means connected between the second terminal of the pn-junction switch and the hold capacitor for increasing the stability of the feedback path.

5. A track and hold amplifier as claimed in claim 1 wherein the input buffer comprises;
   a transistor pair including first and second transistors having respective emitters connected in common to a first current source, a base electrode of the first transistor receiving the input signal and a collector electrode of the second transistor being coupled to a second current source, and
   the feedback connection is part of a feedback path that extends from the collector electrode of the second transistor to a base electrode thereof.

6. A track and hold amplifier as claimed in claim 2 wherein the second means for supplying the switching signal turns the second pn-junction switch off during the hold mode and turns the second pn-junction switch on during the track mode.

7. A track and hold amplifier as claimed in claim 1 wherein the feedback connection further comprises a second pn-junction switch connected in series opposition with the pn-junction switch in the feedback connection.

8. A track and hold amplifier as claimed in claim 7 wherein the feedback connection is part of a feedback path that extends between first and second terminals of the input buffer.

9. A track and hold amplifier comprises:
   an input buffer having a first terminal for receiving an input signal, and second and third terminals,
   a hold capacitor,
   a feedback circuit coupling the second and third terminals of the input buffer, said feedback circuit including a first pn-junction switch means for coupling the hold capacitor to at least one of a said second and third terminals of the input buffer, means for switching the first pn-junction switch on during a tack mode so as to pass thte buffered input signal to the hold capacitor via the first pn-junction switch and for switching the first pn-junction switch off during a hold mode so as to block the passage of the buffered input signal to the hold capacitor, and and for enabling a part of the feedback circuit during the track mode and for disabling said part of the feedback circuit during the hold mode.

10. A track and hold amplifier as claimed in claim 9 wherein the means for enabling and disabling said part of the feedback circuit during the track mode and hold mode, respectivly, comprises a second pn-junction switch within said part of the feedback circuit.

11. A track and hold amplifier as claimed in claim 10 wherein said coupling means couples the hold capacitor to the second and third terminals of the input buffer via the first and second pn-junction switches, repectively.

12. A track and hold amplifier as claimed in claim 10 wherein the first and second pn-junction switches are connected in series opposition in the feedback circuit.

13. A track and hold amplifier as claimed in claim 9 further comprising voltage clamping means coupled to the third terminal of the input buffer.

14. A track and hold amplifier as claimed in claim 9 further comprising resistor means coupled between the hold capacitor and the first pn-junction switch.

15. A track and hold amplifier as claimed in claim 10 wherein said coupling means couples the hold capacitor to the second and third terminals of the input buffer via the first pn-junction switch and an impedence element, respectively.

16. A track anf hold amplifier as claimed in claim 10 wherein the second pn-junction switch comprises a diode-connected transistor.

17. A track and hold amplifier as claimed in claim 9 wherein said coupling means comprises resistor means for seperating the hold capacitor from the feedback circuit thereby to improve the stability of the feedback circuit.

* * * * *